(12) United States Patent
Pang et al.

(10) Patent No.: US 8,508,054 B2
(45) Date of Patent: Aug. 13, 2013

(54) ENHANCED BUMP PITCH SCALING

(75) Inventors: Mengzhi Pang, Irvine, CA (US);
Matthew Kaufmann, Morgan Hill, CA (US)

(73) Assignee: Broadcom Corporation, Irvine, CA (US)

( * ) Notice: Subject to any disclaimer, the term of this patent is extended or adjusted under 35 U.S.C. 154(b) by 40 days.

(21) Appl. No.: 13/162,233

(22) Filed: Jun. 16, 2011

(65) Prior Publication Data

US 2012/0319269 A1 Dec. 20, 2012

(51) Int. Cl.
*H01L 23/52* (2006.01)
*H01L 23/48* (2006.01)
*H01L 29/40* (2006.01)

(52) U.S. Cl.
USPC ...... 257/778; 257/E23.02; 257/738; 257/780; 438/108; 438/109

(58) Field of Classification Search
USPC ............... 257/E21.59, E21.503, E23.02, 737, 257/738, 777, 778, 780, 783; 438/107–109
See application file for complete search history.

(56) References Cited

U.S. PATENT DOCUMENTS

| | | | |
|---|---|---|---|
| 5,360,988 A * | 11/1994 | Uda et al. | 257/529 |
| 5,535,101 A * | 7/1996 | Miles et al. | 361/808 |
| 6,578,754 B1 * | 6/2003 | Tung | 228/180.22 |
| 6,602,732 B2 * | 8/2003 | Chen | 438/106 |
| 6,707,159 B1 * | 3/2004 | Kumamoto et al. | 257/778 |
| 6,731,003 B2 * | 5/2004 | Joshi et al. | 257/737 |
| 7,078,819 B2 * | 7/2006 | DiStefano | 257/779 |
| 2004/0126927 A1 * | 7/2004 | Lin et al. | 438/107 |
| 2007/0069379 A1 * | 3/2007 | Souma et al. | 257/738 |
| 2008/0283998 A1 * | 11/2008 | Choi et al. | 257/692 |

* cited by examiner

*Primary Examiner* — Chris Chu
(74) *Attorney, Agent, or Firm* — Sterne, Kessler, Goldstein & Fox P.L.L.C.

(57) ABSTRACT

An integrated circuit (IC) device is provided. In an embodiment the IC device includes an IC die configured to be bonded onto an IC routing member and a first plurality of pads that is located on a surface of the IC die, each pad being configured to be coupled to a respective pad of a second plurality of pads that is located on a surface of the IC routing member. A pad of the first plurality of pads is offset relative to a respective pad of the second plurality of pads such that the pad of the first plurality of pads is substantially aligned with the respective pad of the second plurality of pads after the IC die is bonded to the IC routing member.

22 Claims, 6 Drawing Sheets

ENHANCED BUMP PITCH SCALING

BACKGROUND

1. Field

The present invention relates to bump pitches in flip-chip integrated circuit devices.

2. Background

Flip-chip integrated circuit (IC) devices include an IC die that is bonded to a substrate through one or more sets of solder bumps. The substrate facilitates interconnection between the IC die and a printed circuit board (PCB) on which the substrate is mounted. Through the PCB, the IC device can be coupled to a number of other devices mounted on the PCB.

Lead-based solder bumps offer advantages in bonding an IC die to a substrate. For example, lead-based solder bumps are relatively flexible and have well-defined melting points. As such, lead-based solder bumps are well-suited to absorb stresses caused by coefficient of thermal expansion (CTE) mismatches between the IC die and the substrate.

Nevertheless, lead-based solder bumps, like many lead-based products, have negative environmental effects. Thus, a trend has developed in which lead-based elements are removed from many products, including IC devices. This trend has resulted in a migration from lead-based solder bumps to lead-free solder bumps. These lead-free solder humps, however, are often not able to absorb stress caused by CTE mismatch, often resulting in the solder bumps cracking when the IC die and the substrate are bonded.

BRIEF SUMMARY

Methods and apparatuses for IC devices with enhanced bump pitches are provided. In an embodiment, an integrated circuit (IC) device is provided. The IC device includes an IC die configured to be bonded onto an IC routing member and a first plurality of pads that is located on a surface of the IC die, each pad being configured to be coupled to a respective pad of a second plurality of pads that is located on a surface of the IC routing member. A pad of the first plurality of pads is offset relative to a respective pad of the second plurality of pads such that the pad of the first plurality of pads is substantially aligned with the respective pad of the second plurality of pads after the IC die is bonded to the IC routing member.

In another embodiment, a method of assembling an integrated circuit (IC) device is provided. The method includes forming a first plurality of bond pads on a surface of an IC die, the surface of the IC die being configured to be bonded to a surface of an IC routing member and a pad of the first plurality of pads being offset relative to a respective pad of a second plurality of pads that are located on the surface of the IC routing member such that the pad of the first plurality of pads is substantially aligned with the respective pad of the second plurality of pads after the IC die is bonded to the IC routing member and bonding the IC die onto the surface of the IC routing member.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 6:
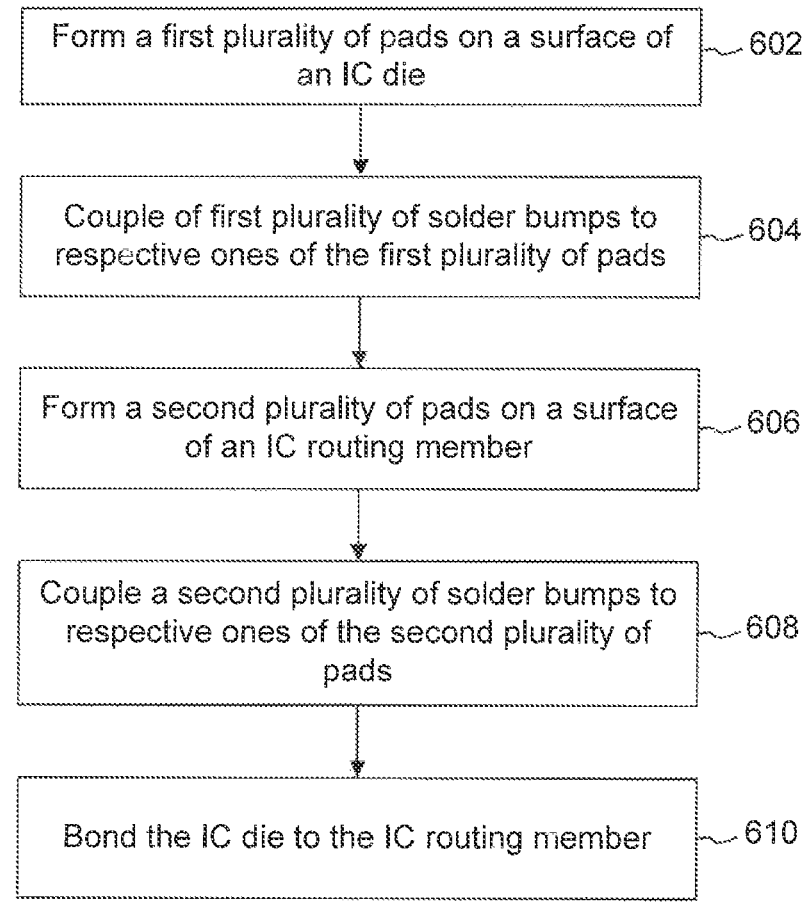

FIG. 6 a flowchart providing example steps for manufacturing an IC device, according to an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Furthermore, it should be understood that spatial descriptions (e.g., "above", "below", "left," "right," "up", "down", "top", "bottom", etc.) used herein are for purposes of illustration only, and that practical implementations of the structures described herein can be spatially arranged in any orientation or manner.

Figure 1:
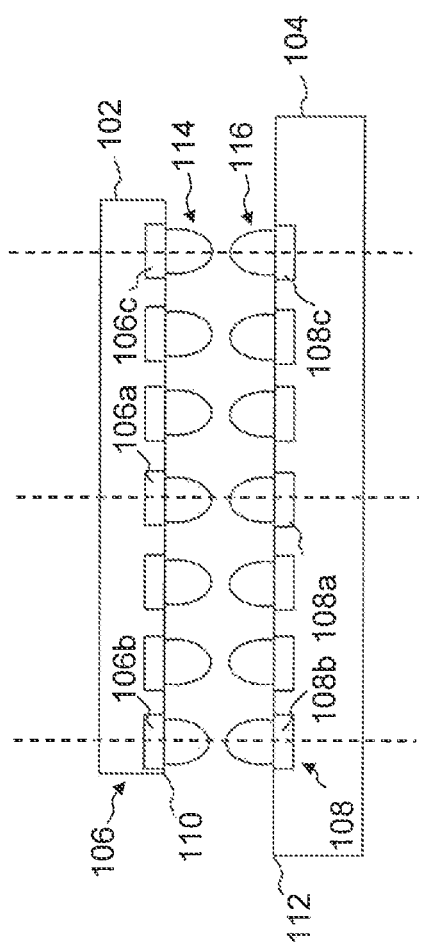
FIGS. 1 and 2 show cross-sectional diagrams of an IC die and an IC routing member before and after bonding, respectively.

FIG. 1 shows a cross-sectional diagram of an IC die 102 and an IC routing member 104 before the two are bonded. IC die 102 can be formed out of silicon or other materials used to make IC dies known to those skilled in the relevant arts. IC die 102 can include multiple ICs each having different functions. In an embodiment, IC die 102 can be an application specific integrated circuit (ASIC).

IC routing member 104 can be one of a variety of different routing elements Used to facilitate communication between IC die 102 and other elements. IC routing member 104 can include a plurality of metal layers separated by dielectric material. The plurality of metal layers can be formed out of a variety of materials known to those skilled in the relevant arts, e.g., copper or aluminum. The dielectric materials can also be selected from those materials known to those skilled in the relevant arts, e.g., silicon dioxide, a polyamide, BCB, liquid crystal polymers, fluropolymers, or epoxies. For example, IC routing member 104 can be a substrate formed out of one of a variety of materials used to form substrates known to those skilled in the relevant art, e.g., FR-4. In such an embodiment, IC die 102 and the substrate can be included in a single IC package. The substrate can be used to facilitate interconnections between IC die 102 and a printed circuit board (PCB). In another embodiment, IC routing member 104 can be a PCB.

A first plurality of contact pads 106 are formed on a surface 110 of IC die 102 and a second plurality of pads 108 are formed on a surface 112 of IC routing member 104. First and second pluralities of solder bumps 114 and 116 are coupled to respective ones of first and second pluralities of pads 106 and 108, respectively. As shown in FIG. 1, respective ones of first plurality of pads 106 and second plurality of pads 108 are substantially aligned. In particular, center pads 106a and 108a and outer pads 106b-c and 108b-c of first and second pluralities of pads 106 and 108, respectively are substantially aligned.

Figure 2:
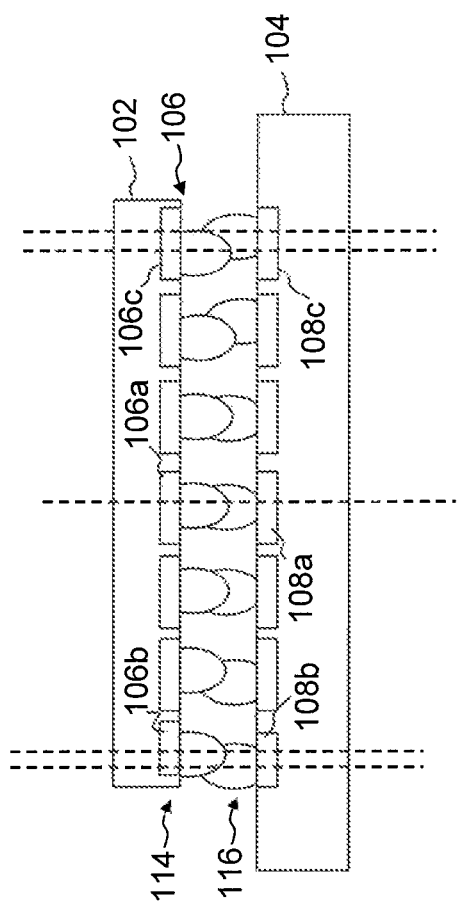

FIG. 2 shows a IC die 102 and IC routing member 104 after they have been bonded together. In an embodiment, solder reflow techniques can be used to bond IC die 102 and IC routing member 104 together. In a solder reflow process, first and second pluralities of solder bumps 114 and 116 are heated past their melting points such that respective ones of first and second pluralities of solder bumps 114 and 116 are fused together. In doing so, first and second pluralities of solder bumps 114 and 116 electrically couple respective ones of first and second pluralities of pads 106 and 108.

During the solder reflow process, IC die 102 and IC routing member 104 are also heated. As such, both IC die 102 and IC routing member 104 expand during the solder reflow process. IC die 102 and IC routing member 104, however, are typically made of different materials having different coefficients of thermal expansion (CTE). Thus, the amount of expansion of IC die 102 is often not equal to amount of expansion of IC routing member 104. This difference in the expansions of IC die 102 and IC routing member 104 results in the misalignment of first and second pluralities of pads 106 and pads 108. Specifically, as shown in FIG. 2, center pads 106a and 108a of first and second pads 106 and 108, respectively, remain substantially aligned, but outer pads 106b-c and 108b-c of first and second plurality of pads 106 and 108, respectively, become misaligned.

Misalignment between respective pads of first and second pluralities of pads 106 and 108 results in respective ones of first and second pluralities of solder bumps 114 and 116 to be misaligned. This results in a stress being exerted on first and second pluralities of solder bumps 114 and 116 where the stress the farther from the center pads. In the embodiment in first and second pluralities of bumps 114 and 116 are lead-based bumps, e.g., SnPb bumps, first and second pluralities of solder bumps 114 and 116 can effectively absorb this stress. In particular, lead-based solder bumps are (1) flexible and (2) have a well-defined melting points. The first characteristic allows the solder bumps to change their shape during the reflow process to accommodate the misalignment. And the second characteristic reduces the likelihood that that the solder bumps will break during the reflow process because each bump remains homogenously either a liquid state or a solid state.

Lead-based solder bumps, however, like many other lead-based products, have been found to have negative environmental effects. Thus, a trend has developed to remove lead from products. In the context of IC devices, lead is removed by using lead-free bumps. In an embodiment, lead-free bumps can be formed out of a combination of tin and silver, e.g., $Sn_{1.8}Ag$ or $Sn_{2.3}Ag$. While these lead-free bumps are typically better for the environment, they often lack the flexibility and well-defined melting points of lead based bumps. For example, lead-free bumps often do not have a particular melting point, but rather have a melting range. Throughout this melting range, the lead-free bump can be a semi-fluid, or "pasty" state. Thus, in the embodiment in which first and second pluralities of bumps 114 and 116 are lead-free bumps, they may not be able to absorb the stress caused by misalignment between first and second pads 106 and 108.

The stress caused by the misalignment can lead to the cracking of lead-free bumps. These cracks can substantially reduce the fidelity of the interconnection between respective ones of the first and second pluralities of pads 106 and 108, thereby hampering the performance of the overall IC device. Because the misalignment is greatest at the edges of IC die 102, the largest and most harmful cracks tend to be present in the solder bumps located on the periphery (or outer regions) of IC die 102 and IC routing member 104.

In embodiments described herein, IC devices are provided in which stress imposed on solder bumps is reduced. Reducing the stress on solder bumps can result in relatively high fidelity connections between an IC die and an IC routing member. For example, reducing the stress on solder bumps can reduce or eliminate the presence of cracks that can develop in the solder bumps. For example, in the embodiment in which the solder bumps are lead-free solder bumps, the reduction of stress on the lead-free solder bumps can decrease the presence of cracks in the lead-free solder humps. It is noted that lead-free solder bumps are one embodiment of solder bumps and that the invention is not limited to any particular type of solder bumps.

For example, in an embodiment, pads of an IC die can be offset relative to a respective pads of the IC routing member. The offset is such that after bonding of the IC die to the IC routing member, the pads of the IC die are substantially aligned with the pads of the IC routing member. Thus, the stresses imposed on solder bumps that couple the pads of the IC die to the pads of the IC routing member can be substantially reduced, resulting in the reduction or elimination of cracks in these connections.

Figure 3:
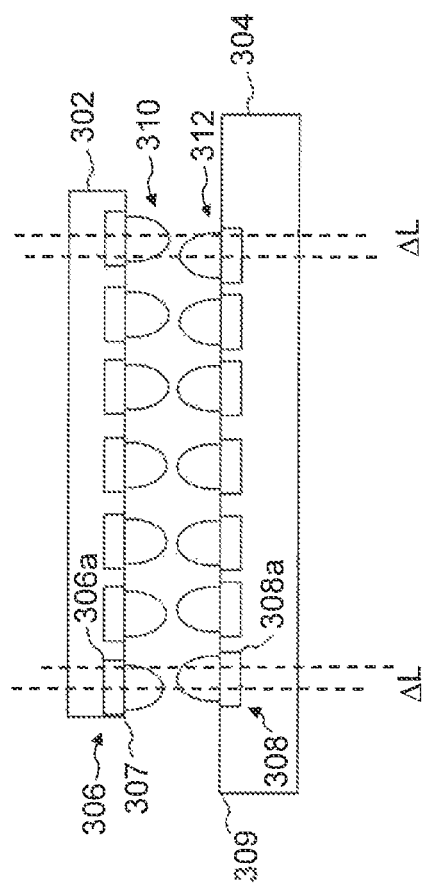
FIGS. 3 and 4 show cross-sectional diagrams of an IC die and an IC routing member before and after bonding, respectively, according to embodiments of the present invention.
Figure 4:
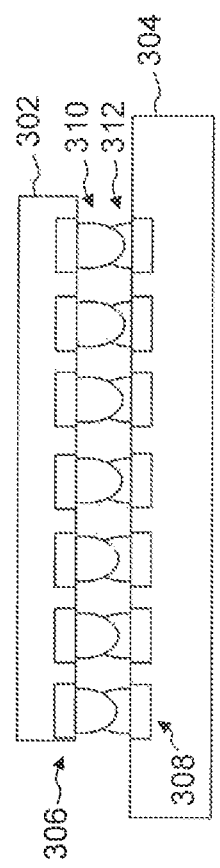

FIGS. 3 and 4 show diagrams illustrating an IC die 302 and an IC routing member 304 before and after bonding, respectively, according to embodiments of the present invention. A first plurality of contact pads 306 is located on a surface 307 of IC the 302 and a second plurality of pads 308 is located on surface 309 of IC routing member 304. First and second plurality of pads 306 and 308 are coupled to respective ones of first and second pluralities of solder bumps 310 and 312, respectively. In an embodiment, first and second pluralities of solder bumps 310 and 312 are lead-free bumps.

Pads of first plurality of pads 306 are offset relative to respective pads of second plurality of pads 308. For example, as shown in FIG. 3, "ΔL" signifies a magnitude of an offset between pad 306a of first plurality of pads 306 and corresponding pad 308A of second plurality of pads 308. The offset between respective pads of first plurality of pads 306 and second plurality of pads 308 is such that, as shown in FIG. 4, after IC die 302 is bonded to IC routing member 304, all of the pads of first plurality of pads 306 are substantially aligned with respective pads of second plurality of pads 308. Being substantially aligned, the stress that would have been exerted on first and second pluralities of solder bumps 310 and 312 is reduced or eliminated. The reduction or elimination of stress, in turn, reduces the occurrence of cracks in first and second pluralities of solder bumps 310 and 312.

The offset between two corresponding pads of first plurality of pads 306 and second plurality of pads 308, ΔL, can be theoretically calculated as $$\Delta L = \Delta\alpha \cdot \Delta T \cdot L, \quad (1)$$

where

Δα is a difference between a coefficient of thermal expansion of IC die 302 and a coefficient of thermal expansion of IC routing member 304, ΔT is a magnitude of a difference between a temperature at which IC die 302 is bonded to IC routing member 304 (e.g., the temperature used in the reflow process) and room temperature, and L is a distance between the pads and the center of the IC die (in the plane of surface 307) when the pads are aligned.

Alternatively, an offset between respective ones of first plurality of pads 306 and second plurality of pads 308 can be determined experimentally by first forming an IC die and an IC routing member having substantially aligned contact pads and measuring the offset after the two have been bonded. Thereafter, this experimentally determined offset can be used to position the pads of the IC die and the IC routing member prior to bonding the IC die and the IC routing member.

It is noted that the methods provided above for determining an offset between respective pads of an IC die and an IC routing member are exemplary and do not limit the scope of the invention. As would be appreciated by those skilled in the relevant art based on the description herein, other methods of determining the offset can be used without departing from the scope and spirit of the present invention.

Figure 5:
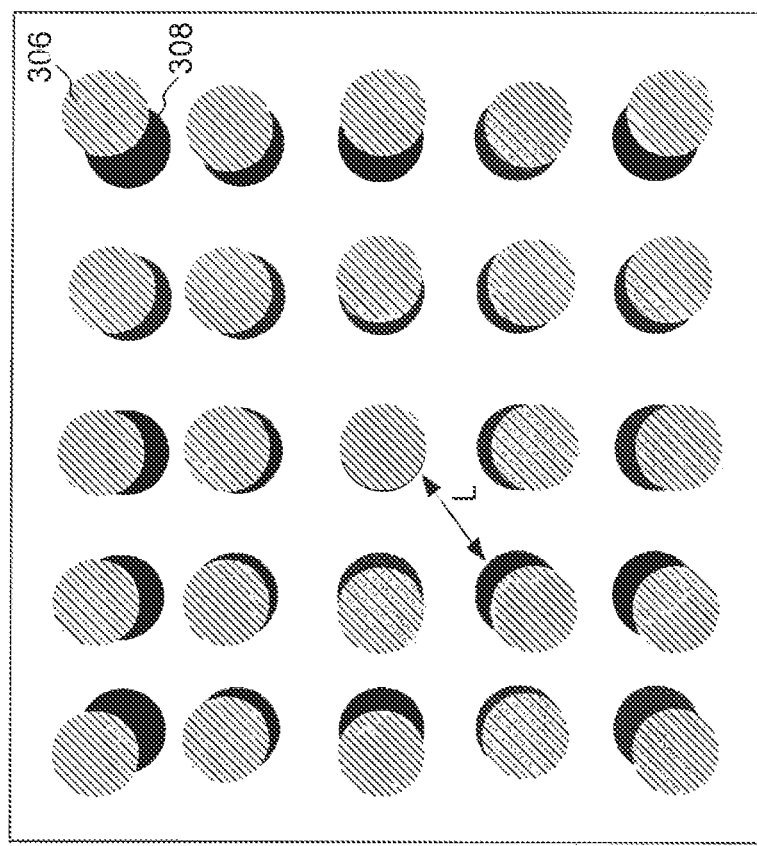
FIG. 5 shows a diagram illustrating overlap between first and second pluralities of pads, according to an embodiment of the present invention.

FIG. 5 shows a diagram 500 illustrating the overlap between respective pads of first and second plurality of pads 306 and 308, according to an embodiment of the present invention. As shown in FIG. 5, the magnitude of the offset, termed "ΔL" above, is proportional to distance, L, between the pad and the center of the die. Thus, in FIG. 5, there is no offset between the pads of a first plurality of pads 306 and second plurality of pads 308 that are located at the center of IC die 302. As the radial distance between a respective pair of pads of first plurality of pads 306 and second plurality of pads 308 increases, the offset between the two also increases. Moreover, the direction of the offset between respective ones of first and second plurality of pads 306 and 308 is in a radial direction extending from the center of IC die 302.

As would be appreciated by those skilled in the relevant arts based on the description herein, the offset provided by equation (1) is a relative offset between respective ones of first and second plurality of pads 306 and 308. As such, this offset can be split between the respective ones of first and second plurality of pads 306 and 308. For example, second plurality of pads 308 can be kept at uniform spacing and pads of plurality of pads 306 can be offset. In other embodiments, the offset between a pair of corresponding pads can be split between the pair of pads. That is, for a pair of corresponding pads, one can be offset by a first offset $\Delta L_1$ and the other can be offset by a second offset $\Delta L_2$ in the opposite direction, where $\Delta L_1 + \Delta L_2 = \Delta L$.

FIG. 6 shows a flowchart 600 providing example steps for manufacturing an IC device, according to an embodiment of the present invention. Other structural and operational embodiments will be apparent to persons skilled in the relevant art(s) based on the following discussion. The steps shown in FIG. 6 do not necessarily have to occur in the order shown. The steps of FIG. 6 are described in detail below.

In step 602, a first plurality of pads is formed on a surface of an IC die. For example, in FIG. 3, the first plurality of pads 306 is formed on surface 307 of IC die 302.

In step 604, a first plurality of solder bumps is coupled to the first plurality of pads. For example, in FIG. 3, respective ones of first plurality of solder bumps 310 are coupled to respective ones of first plurality of pads 306.

In step 606, a second plurality of pads is formed on a surface of an IC routing member. For example, in FIG. 3, second plurality of pads 308 can be formed on surface 309 of IC routing member 304. The first and second plurality of pads are formed such that an offset between respective pads ensures that after the IC die is mounted to the IC routing member, the respective ones of the first plurality and second plurality of pads are aligned. For example, in FIG. 3, there is an offset ΔL between pad 306A of first plurality of pads 306 and corresponding pad 308A of second plurality of pads 308. The offset, ΔL, is configured such that after IC die 302 is mounted onto IC routing member 304 pads 306A and 308A are substantially aligned. The value of ΔL can be calculated using equation (1) provided above and depends on the radial distance, L, from the center of the die.

In step 608, a second plurality of solder bumps is coupled to respective ones of the second plurality of pads. For example, in FIG. 3, second plurality of solder bumps 312 are coupled to respective ones of second plurality of pads 308. In an embodiment, step 608 can be optional. In particular, instead of having solder bumps coupled to each of the first and second plurality of bumps, solder bumps can only be coupled to the first plurality of pads and during bonding, these solder bumps can be melted such that they bond with the second plurality of pads. In a further example, flux can be applied to the second plurality of pads to facilitate bonding.

In step 610, the IC die is bonded to the IC routing member. In an embodiment, the IC die and the IC routing member can be bonded in a solder reflow process in which the first and second pluralities of solder bumps are heated (e.g., to 200° F.) so they are melted into a malleable state such that they can be fused together. For example, in FIG. 4, IC die 302 is bonded to IC routing member 304. As shown in FIG. 4, respective pads of the first and second pluralities of pads 306 and 308 are substantially aligned after bonding.

CONCLUSION

Embodiments of the invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. it is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of the parent application or other related applications. The Applicant therefore rescinds any disclaimer of claim scope made in the parent application, or any predecessor application in relation to the instant application. The Examiner is therefore advised that any such previous disclaimer and the cited references that it was made to avoid, may need to be revisited. Further, the Examiner is also reminded that any disclaimer made in the instant application should not be read into or against the parent application.

What is claimed is:

1. An integrated circuit (IC) device, comprising:
   an IC die configured to be bonded onto an IC routing member; and
   a first plurality of pads that is located on a surface of the IC die, each pad being configured to be coupled to a respective pad of a second plurality of pads that is located on a surface of the IC routing member,
wherein a pad of the first plurality of pads is offset relative to a respective pad of the second plurality of pads such that the pad of the first plurality of pads is substantially aligned with the respective pad of the second plurality of, pads after the IC die is bonded to the IC routing member;
wherein the offset is given by:
$\Delta L = \Delta \alpha \cdot \Delta T \cdot L$, where
$\Delta L$ is the offset,
$\Delta \alpha$ is a difference between a coefficient of thermal expansion of the IC die and a coefficient of thermal expansion of the IC routing member,
$\Delta T$ is a difference between a temperature at which the IC die is mounted to the IC routing member and room temperature, and
L is a distance from the contact pad to a center of the IC die and wherein $\Delta L$, $\Delta \alpha$, $\Delta T$, and L are each greater than zero.

2. The IC device of claim 1, wherein the IC routing member comprises a substrate.

3. The IC device of claim 1, wherein the IC routing member comprises a printed circuit board (PCB).

4. The IC device of claim 1, farther comprising:
a plurality of solder bumps coupled respective ones of the first plurality of pads.

5. The IC device of claim 4, wherein each solder bump of the plurality of solder bumps is a lead-free solder bump.

6. The IC device of claim 5, wherein each solder bump of the plurality of solder bumps comprises silver.

7. The IC device of claim 4, wherein each solder bump of the plurality of solder bumps is configured to be coupled to a respective solder bump of a second plurality of solder bumps that is located on the surface of the IC routing member.

8. The IC device of claim 4, wherein each of the plurality of solder bumps comprises $Sn_{1.8}Ag$.

9. The IC device of claim 4, wherein at least one of the plurality of solder bumps comprises $Sn_{2.3}Ag$.

10. The IC device of claim 1, wherein the offset is in a direction radially away from a center of the IC die.

11. The IC device of claim 1, wherein the IC routing member comprises a plurality of metal layers separated by respective dielectric layers.

12. An integrated circuit (IC) device, comprising:
an IC die configured to be bonded onto an IC routing member; and
a first plurality of pads that is located on a surface of the IC die, each pad being configured to be coupled to a respective pad of a second plurality of pads that is located on a surface of the IC routing member, wherein a pad of the first plurality of pads is offset relative to a respective pad of the second plurality of pads such that the pad of the first plurality of pads is substantially aligned with the respective pad of the second plurality of pads after the IC die is bonded to the IC routing member; and
a plurality of solder bumps coupled to respective ones of the first plurality of pads, wherein at least one of the plurality of solder bumps comprises either $Sn_{1.8}Ag$ or $Sn_{2.3}Ag$.

13. The IC device of claim 12, wherein the offset is given by:
$\Delta L = \Delta \alpha \cdot \Delta T \cdot L$, where
$\Delta L$ is the offset,
$\Delta a$ is a difference between a coefficient of thermal expansion of the IC die and a coefficient of thermal expansion of the IC routing member,
$\Delta T$ is a difference between a temperature at which the IC die is mounted to the IC routing member and room temperature, and
L is a distance from the contact pad to a center of the IC die;
wherein $\Delta L$, $\Delta \alpha$, $\Delta T$, and L are each greater than zero.

14. The IC device of claim 12, wherein the offset is experimentally determined.

15. The IC device of claim 12, wherein a magnitude of the offset is proportional to a distance in a plane of the surface between a center of the IC die and the pad of the first plurality of pads.

16. The IC device of claim 12, wherein the IC routing member comprises a substrate.

17. The IC device of claim 12, wherein the IC routing member comprises a printed circuit board (PCB).

18. The IC device of claim 12, wherein the IC routing member comprises a plurality of metal layers separated by respective dielectric layers.

19. The IC device of claim 12, wherein the offset is in a direction radially away from a center of the IC die.

20. The IC device of claim 12, wherein the offset is split between respective ones of the first and second pluralities of pads.

21. The IC device of claim 12, wherein the IC routing member comprises silicon dioxide.

22. The IC device of claim 12, wherein the IC routing member is configured to couple the IC die to a printed circuit board (PCB).

* * * * *

UNITED STATES PATENT AND TRADEMARK OFFICE
CERTIFICATE OF CORRECTION

PATENT NO. : 8,508,054 B2
APPLICATION NO. : 13/162233
DATED : August 13, 2013
INVENTOR(S) : Pang et al.

Page 1 of 1

It is certified that error appears in the above-identified patent and that said Letters Patent is hereby corrected as shown below:

In the Claims

Column 7
Line 7, Claim 1, please replace "of, pads" with --of pads--.

Column 7
Line 25, Claim 5, now Claim 4, please replace "farther" with --further--.

Column 7
Line 26, Claim 5, now Claim 4, please replace "coupled respective" with --coupled to respective--.

Column 8
Line 17, Claim 23, now Claim 13, please replace "Δa" with --Δα--.

Signed and Sealed this
First Day of October, 2013

Teresa Stanek Rea
*Deputy Director of the United States Patent and Trademark Office*